United States Patent
Tsai et al.

(10) Patent No.: US 11,996,472 B2
(45) Date of Patent: **\*May 28, 2024**

(54) MULTI-LAYER DIELECTRIC REFILL FOR PROFILE CONTROL IN SEMICONDUCTOR DEVICES

(71) Applicant: Taiwan Semiconductor Manufacturing Company Limited, Hsinchu (TW)

(72) Inventors: Ya-Yi Tsai, Hsinchu (TW); Chi-Hsiang Chang, Hsinchu (TW); Shih-Yao Lin, New Taipei (TW); Tzu-Chung Wang, Hsinchu (TW); Shu-Yuan Ku, Zhubei (TW)

(73) Assignee: Taiwan Semiconductor Manufacturing Company Limited, Hsinchu (TW)

( \* ) Notice: Subject to any disclaimer, the term of this patent is extended or adjusted under 35 U.S.C. 154(b) by 0 days.

This patent is subject to a terminal disclaimer.

(21) Appl. No.: 18/166,896

(22) Filed: Feb. 9, 2023

(65) Prior Publication Data

US 2023/0187542 A1    Jun. 15, 2023

Related U.S. Application Data

(63) Continuation of application No. 17/237,681, filed on Apr. 22, 2021, now Pat. No. 11,600,718.

(51) Int. Cl.
*H01L 29/06* (2006.01)
*H01L 21/82* (2006.01)
(Continued)

(52) U.S. Cl.
CPC .. *H01L 29/6681* (2013.01); *H01L 21/823431* (2013.01); *H01L 29/0649* (2013.01); *H01L 29/41791* (2013.01); *H01L 29/785* (2013.01)

(58) Field of Classification Search
CPC ........... H01L 29/0649; H01L 29/41791; H01L 29/6681; H01L 29/785; H01L 21/823431
(Continued)

(56) References Cited

U.S. PATENT DOCUMENTS

| 8,921,940 B2 | 12/2014 | Kim et al. |
| 11,120,997 B2 | 9/2021 | Chen et al. |

(Continued)

FOREIGN PATENT DOCUMENTS

| TW | 201913878 A | 4/2019 |
| TW | 201916120 A | 4/2019 |

OTHER PUBLICATIONS

Foreign Action other than Search Report on non-Foley case related to US dated Oct. 26, 2022.
(Continued)

*Primary Examiner* — Monica D Harrison
(74) *Attorney, Agent, or Firm* — FOLEY & LARDNER LLP

(57) ABSTRACT

A semiconductor device and method of fabricating a semiconductor device involves formation of a trench above a fin (e.g. a fin of a FinFET device) of the semiconductor device and formation of a multi-layer dielectric structure within the trench. The profile of the multi-layer dielectric structure can be controlled depending on the application to reduce shadowing effects and reduce cut failure risk, among other possible benefits. The multi-layer dielectric structure can include two layers, three layers, or any number of layers and can have a stepped profile, a linear profile, or any other type of profile.

20 Claims, 12 Drawing Sheets

(51) Int. Cl.
    *H01L 21/8234*    (2006.01)
    *H01L 29/417*     (2006.01)
    *H01L 29/66*      (2006.01)
    *H01L 29/78*      (2006.01)
(58) Field of Classification Search
    USPC .......................................................... 257/365
    See application file for complete search history.

(56) References Cited

U.S. PATENT DOCUMENTS

| | | | |
|---|---|---|---|
| 11,600,718 B2 * | 3/2023 | Tsai | ................ H01L 21/823431 |
| 2019/0067120 A1 | 2/2019 | Chiang et al. | |
| 2020/0135893 A1 | 4/2020 | Bi et al. | |
| 2020/0279936 A1 | 9/2020 | Zhou | |

OTHER PUBLICATIONS

Non-Final Office Action on U.S. Appl. No. 17/237,681 dated Apr. 26, 2022.
Notice of Allowance on U.S. Appl. No. 17/237,681 dated Nov. 7, 2022.
Taiwan Office Action issued in connection with TW Appl. Ser. No. 111107319 dated Oct. 27, 2022.

* cited by examiner

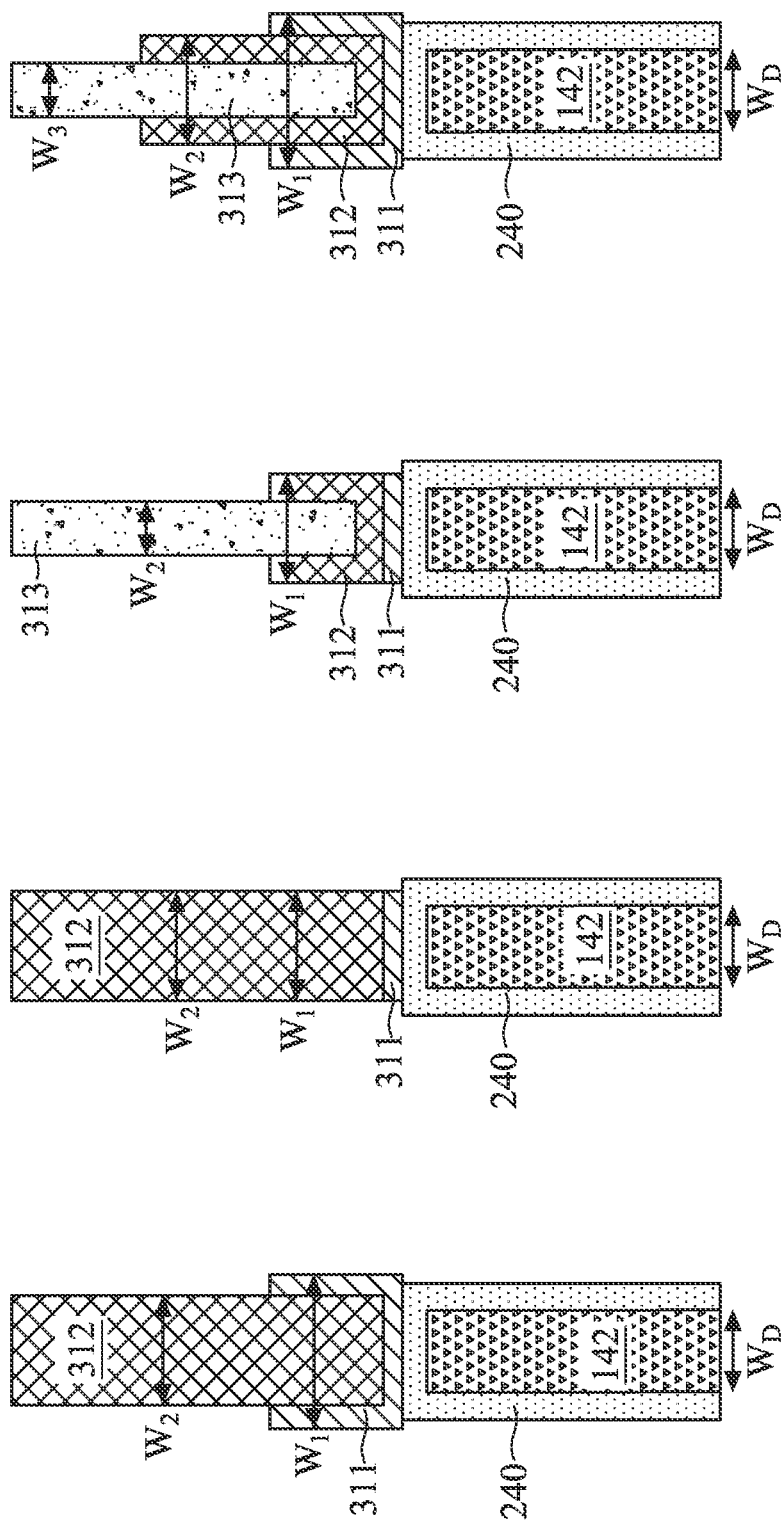

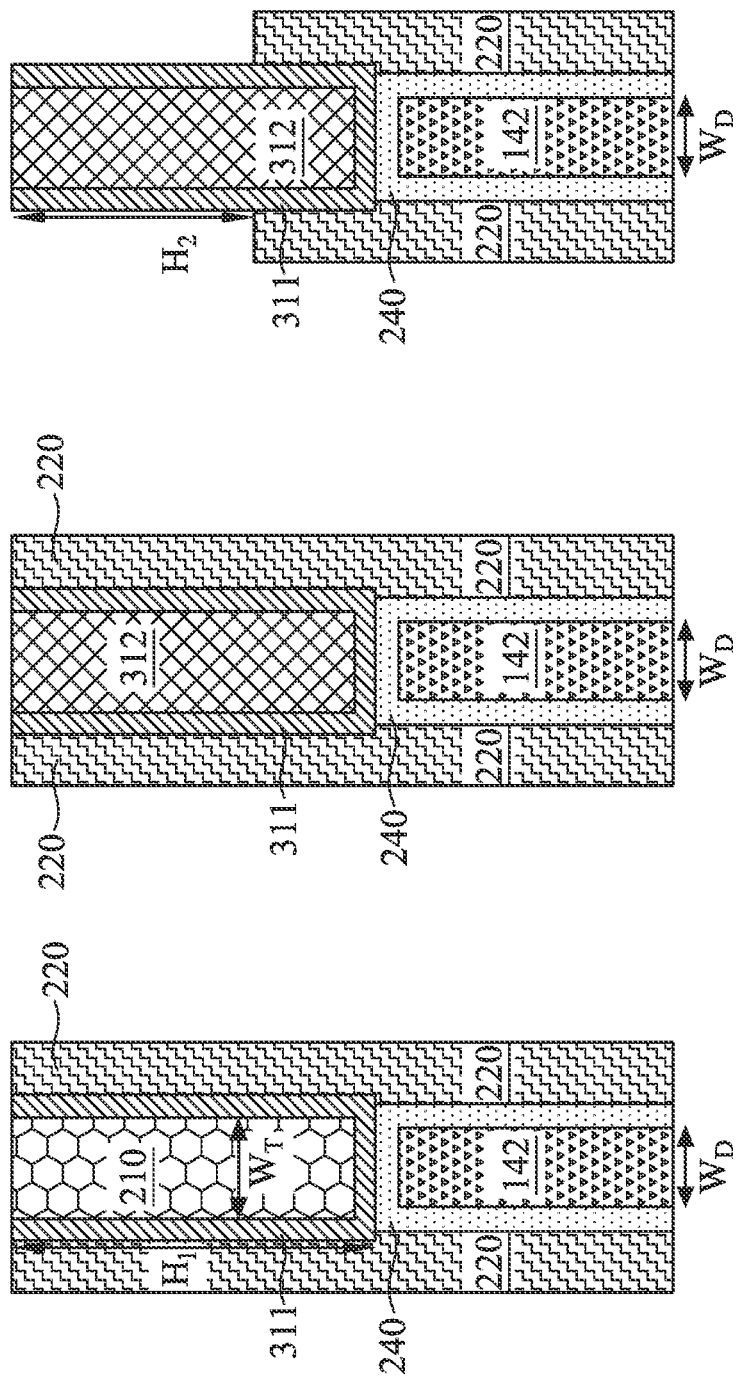

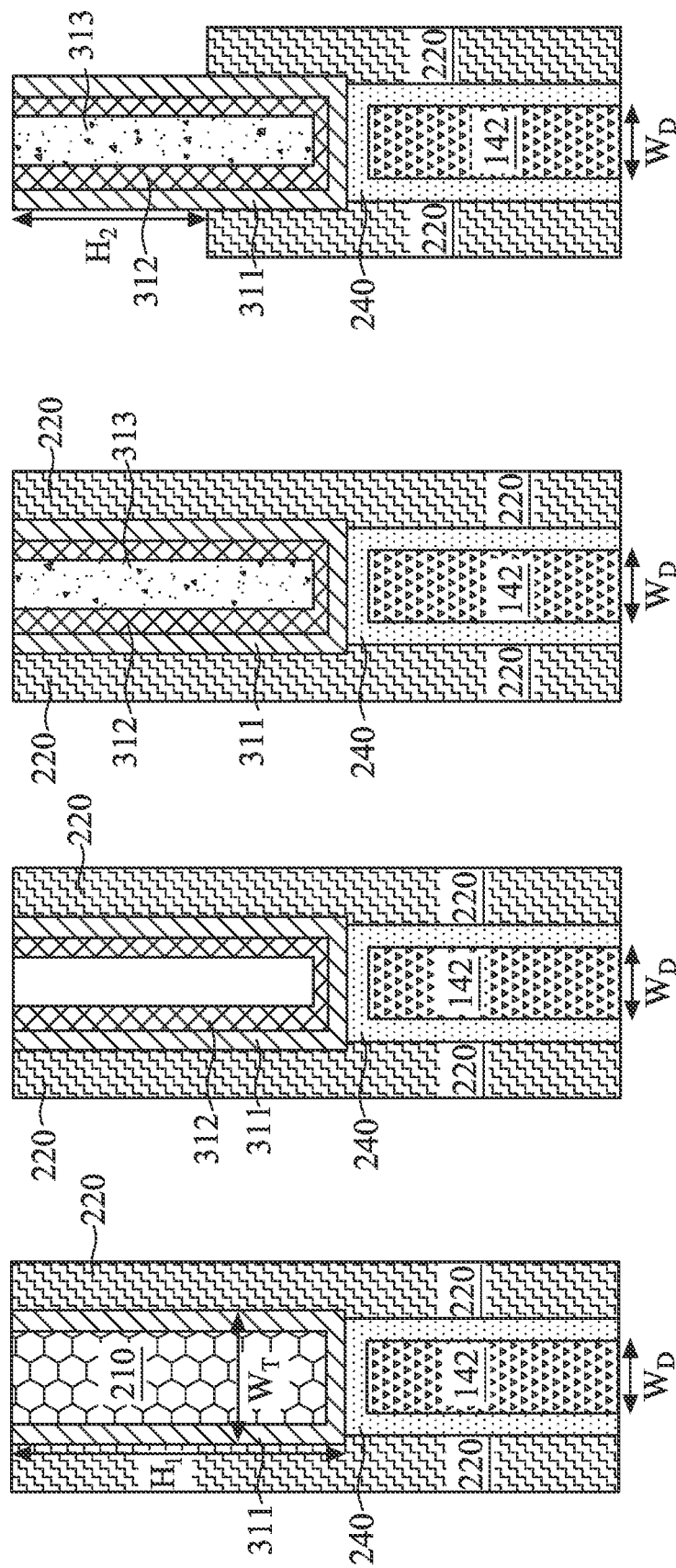

MULTI-LAYER DIELECTRIC REFILL FOR PROFILE CONTROL IN SEMICONDUCTOR DEVICES

CROSS-REFERENCE TO RELATED APPLICATIONS

This application is a Continuation of U.S. patent application Ser. No. 17/237,681, filed Apr. 22, 2021. The entire disclosure of U.S. patent application Ser. No. 17/237,681 is incorporated herein by reference.

BACKGROUND

The present disclosure generally relates to semiconductor devices and methods for fabricating semiconductor devices, and particularly to formation of insulating layers within semiconductor devices to provide electrical isolation. As feature size in semiconductor devices continues to decrease, significant challenges may arise with respect to forming thin insulating layers in strategic locations within semiconductor devices. Undesirable effects such as may arise due to these challenges, such as reduced semiconductor device yield. Semiconductor devices are used in a wide variety of electronics, and improvements regarding both production and performance of semiconductor devices are generally desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D illustrate various examples of a multi-layer dielectric structure that can be formed in the semiconductor device of FIG. 1, in accordance with some embodiments.

FIGS. 4B-4F illustrate cross sections of the semiconductor device of FIG. 1 at various steps of the process of FIG. 4A, in accordance with some embodiments.

FIGS. 6B-6I illustrate cross sections of the semiconductor device of FIG. 1 at various steps of the process of FIG. 6A, in accordance with some embodiments.

DETAILED DESCRIPTION

Figure 1:
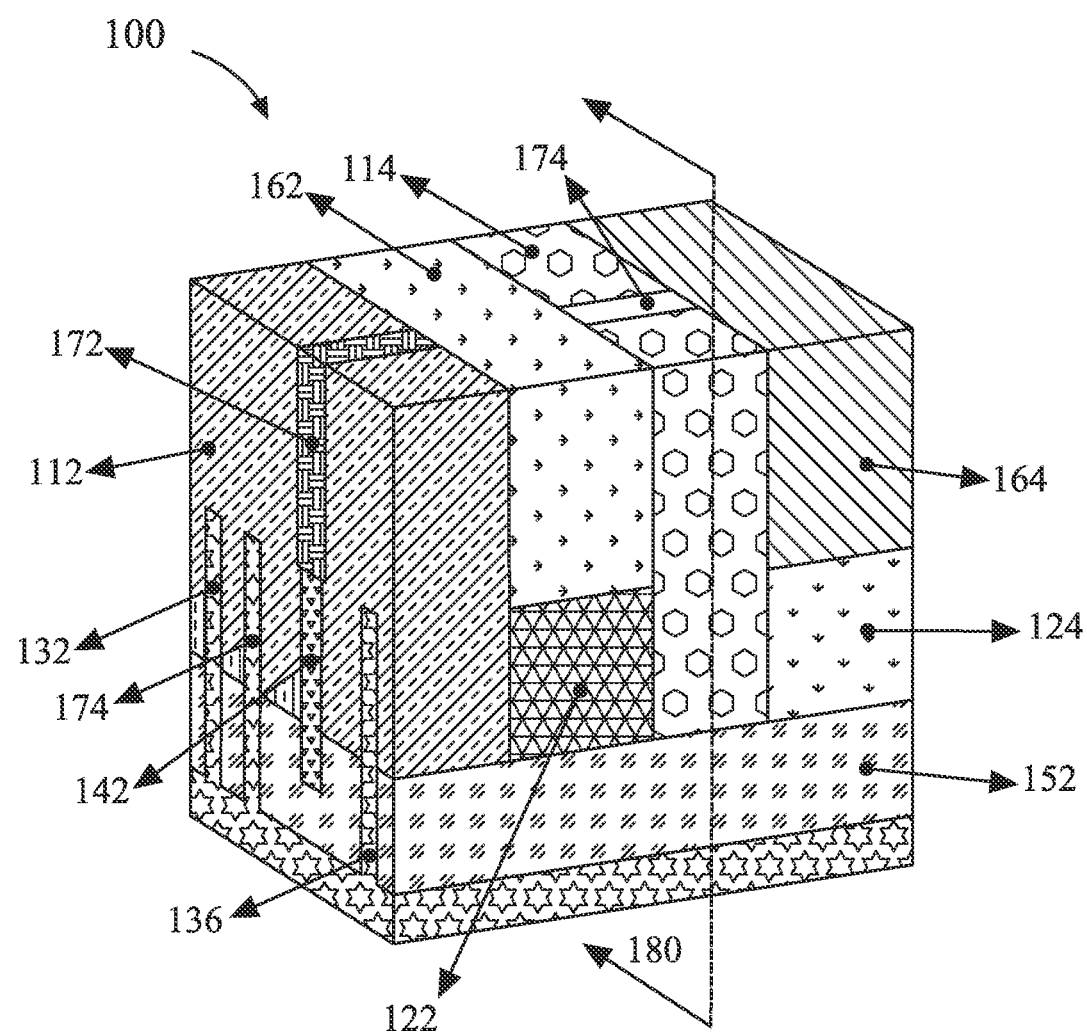
FIG. 1 illustrates a perspective view of an example semiconductor device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a semiconductor device and method for forming a semiconductor device involving use of a multi-layer dielectric for profile control in semiconductor devices. The multi-layer dielectric can be used to more completely fill trenches during the fabrication process to prevent formation of air gaps and shadowing effects. Moreover, the multi-layer dielectric can be used to account for variations in removal processes such as polysilicon removal processes occurring before formation of metal gate structures. The multi-layer dielectric structures described herein can thereby lead to improvements in semiconductor device yield and semiconductor device performance.

Referring now to FIG. 1, a perspective view of an example semiconductor device 100 is shown, in accordance with some embodiments. Semiconductor device 100 is generally a fin field-effect transistor (FinFET) structure. However the approaches described herein can also be implemented in other transistor structures such as nanosheet field-effect transistor structures, gate-all-around field-effect transistor (GAAFET) structures, and other similar types of transistor structures. Semiconductor device 100 is shown to include a gate 112, a gate 114, a source/drain region 122, a source/drain region 124, an active fin 132, an active fin 134, an active fin 136, a dummy fin 142, an isolation structure 152, an insulating layer 162, an insulating layer 164, a dielectric layer 172, and a dielectric structure 174. Also shown in FIG. 1 is a cross section 180 that is cut with gate 114. Semiconductor device 100 can generally be implemented in an integrated circuit (IC).

Gate 112 and gate 114 can both be implemented as metal gate structures, such as high-k metal gate (HKMG) structures. In such implementations, a stack including conductive metal material and dielectric material with a high dielectric constant (high-k) is formed. The stack can also include a work function layer, a capping layer, and/or other layers to form a suitable HKMG structure for the intended application. The HKMG structure can be formed using a variety of suitable processes, including both gate-first and gate-last implementations. Gate 112 and gate 114 are disposed in generally parallel relation, and can be part of a parallel gate stack that includes additional, similar gate structures not shown in FIG. 1. In some applications, the use of a HKMG structure as compared to the use of a polysilicon gate can provide reduced charge leakage and thereby improved performance. However, it will be appreciated that the techniques described herein can also be applied to semiconductor devices with polysilicon gate structures, among other types of gate structures. In some embodiments, a dummy gate structure (e.g. dummy gate 220 described in more detail below) is formed during the fabrication process for semiconductor device 100 to assist in formation of spacer layers and/or other insulating layers within semiconductor device 100. Upon completion of the fabrication process for semiconductor device 100, it will be appreciated that in some embodiments both gate 112 and gate 114 are disposed adjacent to spacer layers to provide electrical isolation of gate 112 and gate 114.

Source/drain region 122 and source/drain region 124 can both be formed of epitaxial material using an epitaxial growth process. For example, an epitaxy region for forming source/drain region 122 can be opened by removing portions of active fin 132, active fin 134, active fin 136, and dummy fin 142. Then, epitaxial growth processes such as chemical vapor deposition (CVD), vapor-phase epitaxy (VPE), molecular-beam epitaxy (MBE), liquid-phase epitaxy (LPE), and other suitable processes and combinations thereof can be used to form the epitaxial material for source/drain region 122 within the epitaxy region. Similarly, an epitaxy region for forming source/drain region 124 can be opened by removing portions of active fin 132, active fin 134, active fin 136, and dummy fin 142. Then, the epitaxial material for source/drain region 124 can be formed within the epitaxy region using suitable epitaxial growth processes. Source/drain region 122 and source/drain region 124 can be doped using suitable dopants including n-type and p-type dopants such as arsine, phosphine, diborane, and other suitable dopants and combinations thereof.

Active fin 132, active fin 134, and active fin 136 are generally formed of conductive material and provide a pathway for current to flow. Active fin 132, active fin 134, and active fin 136 can be formed using materials such as silicon (Si), silicon germanium (SiGe), and other suitable conductive materials and combinations thereof. In some embodiments, semiconductor device 100 is a FinFET device, and active fin 132, active fin 134, and active fin 136 are active fins of the FinFET device. Active fin 132, active fin 134, and active fin 136 generally extend above isolation structure 152 and are disposed in generally parallel relation to dummy fin 142.

Dummy fin 142 is generally formed of dielectric insulating material and does not provide a pathway for current to flow as active fin 132, active fin 134, and active fin 136 do. Instead, dummy fin 142 can reduce strain on a substrate of semiconductor device 100 by providing a structure similar to active fin 132, active fin 134, and active fin 136 in an inactive region of semiconductor device 100. As shown in FIG. 1, active fin 132, active fin 134, and active fin 136 are disposed on opposing sides of dummy fin 142 and in parallel relation to dummy fin 142. The inclusion of dummy fin 142 can further provide critical dimension (CD) uniformity in semiconductor device 100, and can thereby provide improved ease and efficiency with respect to fabrication of semiconductor device 100 as well improved performance of semiconductor device 100. In some embodiments, dummy fin 142 is the same or about the same in size and shape as active fin 132, active fin 134, and active fin 136. However, dummy fin 142 can also be implemented as being larger, smaller, thicker, thinner, taller, or shorter when compared to active fin 132, active fin 134, and active fin 136. In some embodiments, semiconductor device 100 is a FinFET device, and dummy fin 142 is an inactive fin of the FinFET device. Dummy fin 142 can be formed as a single film or a complex film, and can be formed using materials such as silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof.

Isolation structure 152 generally prevents leakage of electric current between components of semiconductor device 100. Isolation structure 152 can be implemented as a shallow trench isolation (STI) structure, for example. Isolation structure 152 can be formed by creating trenches within a substrate of semiconductor device 100 (e.g. a bulk silicon substrate), filling the trenches with insulating material (e.g. dielectric material such as silicon dioxide), and removing excess insulating material using processes such as chemical-mechanical polishing (CMP). Isolation structure 152 can generally provide a base for forming other components of semiconductor device 100 such as active fin 132, active fin 134, active fin 136, dummy fin 142, gate 114, and source/drain region 122 thereon.

Insulating layer 162 and insulating layer 164 can be implemented using various types of materials. For example, insulating layer 162 and insulating layer 164 can be implemented as inter-layer dielectrics (ILD) and/or contact etch stop layers (CESL). In implementations where insulating layer 162 and/or insulating layer 164 are inter-layer dielectrics, insulating layer 162 and/or insulating layer 164 can be formed using dielectric materials with a low dielectric constant (low-k materials) such as doped silicon dioxide, porous silicon dioxide, and other suitable materials and combinations thereof.

Dielectric layer 172 and dielectric structure 174 are generally disposed above dummy fin 142. Dielectric layer 172 provides electrical isolation of gate 112, and dielectric structure 174 provides electrical isolation of gate 114. Dielectric layer 172 and dielectric structure 174 can be disposed above dummy fin 142 in certain areas of semiconductor device 100 to provide electrical isolation for structures such as gate 112, gate 114, and other similar structures. Dielectric layer 172 and dielectric structure 174 can be formed using dielectric materials with a high dielectric constant (high-k materials), dielectric materials with a low dielectric constant (low-k materials), or a combination thereof, including materials such silicon dioxide ($SiO_2$), silicon oxynitride (SiON), silicon nitride ($Si_3N_4$), silicon carbon nitride (SiCN), silicon oxycarbonitride (SiOCN), hafnia ($HfO_2$), tantalum nitride (TaN), and other suitable materials and combinations thereof.

Figure 2:
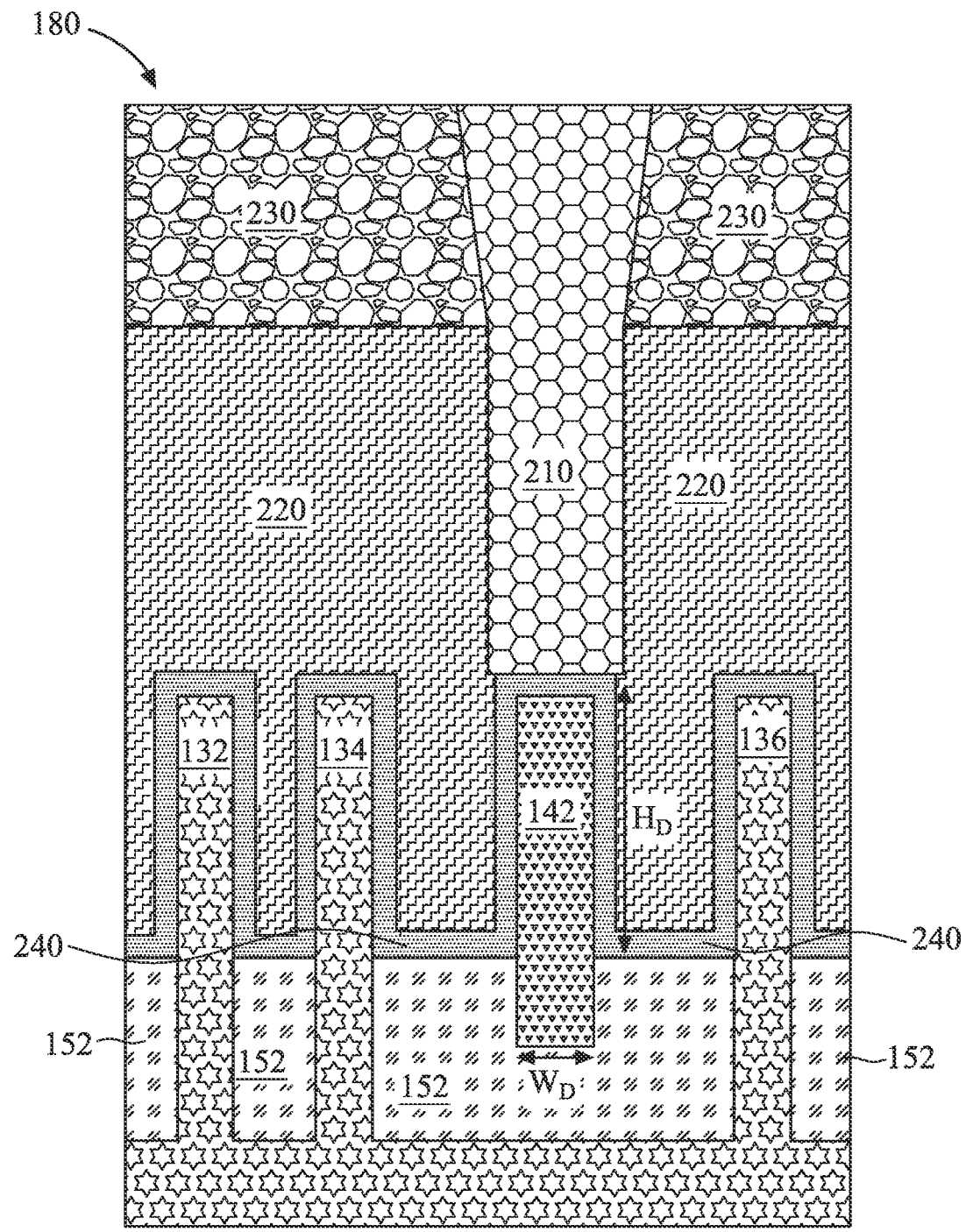
FIG. 2 illustrates a cross section of the semiconductor device of FIG. 1 cut with a gate region, in accordance with some embodiments.

Referring now to FIG. 2, a cross section of semiconductor device 100 as cut from cross section 180 illustrated in FIG. 1 (cut with gate 114) is shown, in accordance with some embodiments. It will be appreciated that FIG. 2 illustrates a cross section of semiconductor device 100 at a point in time during the fabrication process and before the completion of the fabrication process. Specifically, the cross section of FIG. 2 shows semiconductor device 100 at a point in time associated with the formation of dielectric structure 174. In order to prevent significant shadowing effects resulting from the formation of gate 114, dielectric structure 174 can be formed using a multi-layered approach, and thereby the profile of dielectric structure 174 can be controlled (e.g. because dielectric structure 174 can be made thinner, or the profile of dielectric structure 174 can otherwise be controlled to reduce shadowing effects). By controlling the profile of dielectric structure 174, gate 114 (and associated work function layers, spacer layers, etc.) can contact dielectric structure in a variety of different manners depended on the intended application to reduce shadowing effects. For example, the gate 114 (with associated layers) may contact one or more of dielectric layers 311, 312 and 313 (see FIGS. 3A-3D, 4A-4F, 5B-5F, 6B-6I). The gate 114 may contact top surfaces and/or side surfaces of the dielectric layers 311, 312 and 313.

In the cross section of FIG. 2, a dummy gate dielectric layer 240 is formed over active fin 132, active fin 134, active fin 136, dummy fin 142, and isolation structure 152. Additionally, a dummy gate 220 is formed over dummy gate dielectric layer 240, and a mask layer 230 is formed over dummy gate 220. The use of dummy gate 220 along with dummy gate dielectric layer 240 and mask layer 230 can facilitate improved formation of spacer layers that ultimately provide electrical isolation of gate 114. Before fabrication of semiconductor device 100 is complete, each of dummy gate 220, mask layer 230, and dummy gate dielectric layer 240 are at least partially removed. For example, a gate-last process can be used to replace dummy gate 220 with an active gate, such as gate 114 described above. Since the profile of dielectric structure 174 can be controlled using the multi-layered approach, undesirable effects that may occur during formation of gate 114 such as poor metal gap fill and anti-reflective coating (e.g. BARC) residues can be avoided or reduced.

Dummy gate 220 is formed using polysilicon material, in some embodiments. However, other suitable materials including both conductive materials and insulating materials, and various combinations thereof, can also be used to form dummy gate 220. Accordingly, dummy gate 220 can be removed using various suitable process including wet etching processes, dry etching processes, plasma etching processes, reactive ion etching processes, and other suitable processes and combinations thereof. As shown in the cross section of FIG. 2, a portion of dummy gate 220 and a portion of mask layer 230 have been removed in an area above dummy fin 142 such that a trench 210 is formed. A slice of dummy gate 220 and mask layer 230 are essentially cut out in order to form trench 210. Then, after trench 210 is formed, dielectric structure 174 is formed within trench 210 such that it is disposed over dummy fin 142.

Mask layer 230 can be formed using various materials including metals and metal compounds such as titanium (Ti), tantalum (Ta), titanium nitride (TiN), tantalum nitride (TaN), and other suitable materials and combinations thereof. In some embodiments. Mask layer 230 is a hard mask layer that facilitates removal of underlying polysilicon material used to form dummy gate 220. For example, a hard mask can be more suitable for a plasma etching process than a softer mask such as a polymer mask due to the intensity of the etching process needed to remove the underlying polysilicon material. Mask layer 230 can ultimately be removed from semiconductor device 100 using processes such as chemical mechanical polishing (CMP) and other suitable processes and combination thereof.

Dummy gate dielectric 240 can be formed using a variety of materials including silicon oxide ($SiO_2$), silicon nitride ($Si_3N_4$), and other suitable materials and combinations thereof. In some embodiments, dummy gate dielectric 240 serves as an etch stop layer such that underlying structures including active fin 132, active fin 134, active fin 136, dummy fin 142, and isolation structure 152 are protected during the removal of dummy gate 220. Upon removal of dummy gate dielectric 240, active fin 132, active fin 134, active fin 136 are exposed such that gate 114 can be formed over active fin 132, active fin 134, active fin 136. Dummy gate dielectric 240 may only be partially removed such that active fin 132, active fin 134, active fin 136 are exposed but dummy fin 142 and possibly portions of the top surface of isolation structure 152 remain covered by dummy gate dielectric 240. In some embodiments, dummy gate dielectric 240 is removed such that dummy fin 140 is exposed, and a portion of dummy fin 140 is removed.

As shown in FIG. 2, the height of dummy fin 142 measured from a top surface of isolation structure 152 is denoted by the variable $H_D$ and the width of dummy fin 142 is denoted by the variable $W_D$. In some embodiments, the height $H_D$ is between 50 angstroms and 1500 angstroms, however heights outside of the range are also contemplated. The height $H_D$ can be equal to the heights of active fin 132, active fin 134, active fin 136 (measured from the top surface of isolation structure 152), or the height $H_D$ can be taller or shorter than the heights of active fin 132, active fin 134, active fin 136 (measured from the top surface of isolation structure 152). In some embodiments, the width $W_D$ is between 5 angstroms and 500 angstroms, however widths outside of this range are also contemplated. The width $W_D$ can be considered the critical dimension (CD) of dummy fin 142 as it is generally the smallest feature of dummy fin 142.

Referring now to FIGS. 3A-3D, various examples of a multi-layered approach to forming dielectric structure 174 are shown, in accordance with some embodiments. By using a multi-layered approach to forming dielectric structure 174, the profile of dielectric structure 174 can be controlled. For example, dielectric structure 174 can be formed with a linear profile and can be made thinner using a multi-layered approach. Moreover, dielectric structure 174 can be formed with a stepped profile using a multi-layered approach.

In FIG. 3A, dielectric structure 174 includes both a first dielectric layer 311 and a second dielectric layer 312. Both the first dielectric layer 311 and the second dielectric layer 312 are disposed above dummy fin 142 and dummy fin dielectric 240, and within trench 210. As shown in FIG. 3A, the variable $W_1$ denotes the width of the first dielectric layer 311 and the variable $W_2$ denotes the width of the second dielectric layer 312. In the embodiment of FIG. 3A, the width $W_1$ is greater than the width $W_2$ such that dielectric structure 174 has a stepped profile. An example process for fabricating the structure shown in FIG. 3A is described below with respect to process 400. Depending on the intended application, the embodiment shown in FIG. 3A can provide advantages in terms of semiconductor device yield and semiconductor device performance.

In FIG. 3B, dielectric structure 174 includes both the first dielectric layer 311 and the second dielectric layer 312. Both the first dielectric layer 311 and the second dielectric layer 312 are disposed above dummy fin 142 and dummy fin dielectric 240, and within trench 210. As shown in FIG. 3B, the variable $W_1$ denotes the width of the first dielectric layer 311 and the variable $W_2$ denotes the width of the second dielectric layer 312. In the embodiment of FIG. 3B, the width $W_1$ is equal to or about equal to (e.g. within 10%) the width $W_2$ such that dielectric structure 174 has a linear profile. However, as discussed with respect to the example process 500 for fabricating the structure shown in FIG. 3B, the use of both the first dielectric layer 311 and the second dielectric layer 312 can provide advantages in terms of forming a thinner overall dielectric structure 174. Accordingly, the widths $W_1$ and $W_2$ can be made thinner than the width $W_D$. By making dielectric structure 174 thinner, the process window for forming gate 114 can be enlarged, thereby leading to improvements in the formation of gate 114. Depending on the intended application, the embodiment shown in FIG. 3A can provide advantages in terms of semiconductor device yield and semiconductor device performance.

In FIG. 3C, dielectric structure 174 includes both the first dielectric layer 311 and the second dielectric layer 312, as well as a third dielectric layer 313. The first dielectric layer 311, the second dielectric layer 312, and the third dielectric layer 313 are all disposed above dummy fin 142 and dummy fin dielectric 240, and within trench 210. As shown in FIG. 3C, the variable $W_1$ denotes the width of the first dielectric layer 311 and the second dielectric layer 312 (these are equal or about equal), and the variable $W_2$ denotes the width of the third dielectric layer 313. In the embodiment of FIG. 3C, the width $W_1$ is greater than the width $W_2$ such that dielectric structure 174 has a stepped profile, similar to the structure shown in FIG. 3A. However, unlike the structure of FIG. 3A, the inclusion of the third dielectric layer in the structure of FIG. 3C allows dielectric structure 174 overall to be thinner. That is, the width $W_1$ in FIG. 3C is smaller than the width $W_1$ in FIG. 3A, and the width $W_2$ in FIG. 3C is smaller than the width $W_2$ in FIG. 3A. An example process for fabricating the structure shown in FIG. 3C is described below with respect to process 600. Depending on the intended application, the embodiment shown in FIG. 3C can provide advantages in terms of semiconductor device yield and semiconductor device performance.

In FIG. 3D, dielectric structure 174 also includes the first dielectric layer 311, the second dielectric layer 312, and the third dielectric layer 313. The first dielectric layer 311, the second dielectric layer 312, and the third dielectric layer 313 are all disposed above dummy fin 142 and dummy fin dielectric 240, and within trench 210. As shown in FIG. 3D, the variable $W_1$ denotes the width of the first dielectric layer 311, the variable $W_2$ denotes the width of the second dielectric layer 312, and the variable $W_3$ denotes the width of the third dielectric layer 313. In the embodiment of FIG. 3D, the width $W_1$ is greater than the width $W_2$ and the width $W_2$ is greater than the width $W_3$ such that dielectric structure 174 has a dual-stepped profile. It will be appreciated that the widths illustrated in FIG. 3D may not be drawn exactly to scale, and that the width $W_1$ can be made smaller than the width $W_D$. Depending on the intended application, the embodiment shown in FIG. 3D can provide advantages in terms of semiconductor device yield and semiconductor device performance.

While various examples of a multi-layer dielectric structure 174 are provided in FIGS. 3A-3D, it will be appreciated that multi-layer dielectric structures not explicitly shown or described herein are contemplated within the scope of the present disclosure. For example, while embodiments where dielectric structure 174 is formed using two or three dielectric layers, it will be appreciated that any number of dielectric layers may be used to control the profile of dielectric structure 174 and any other similar dielectric structures within a variety of different types of semiconductor devices. Moreover, while stepped and linear profiles are described, other types of profiles including sloped profiles, rounded profiles, pointed profiles, and various other types of profiles may be implemented in a multi-layer dielectric structure for profile control.

Figure 4A:
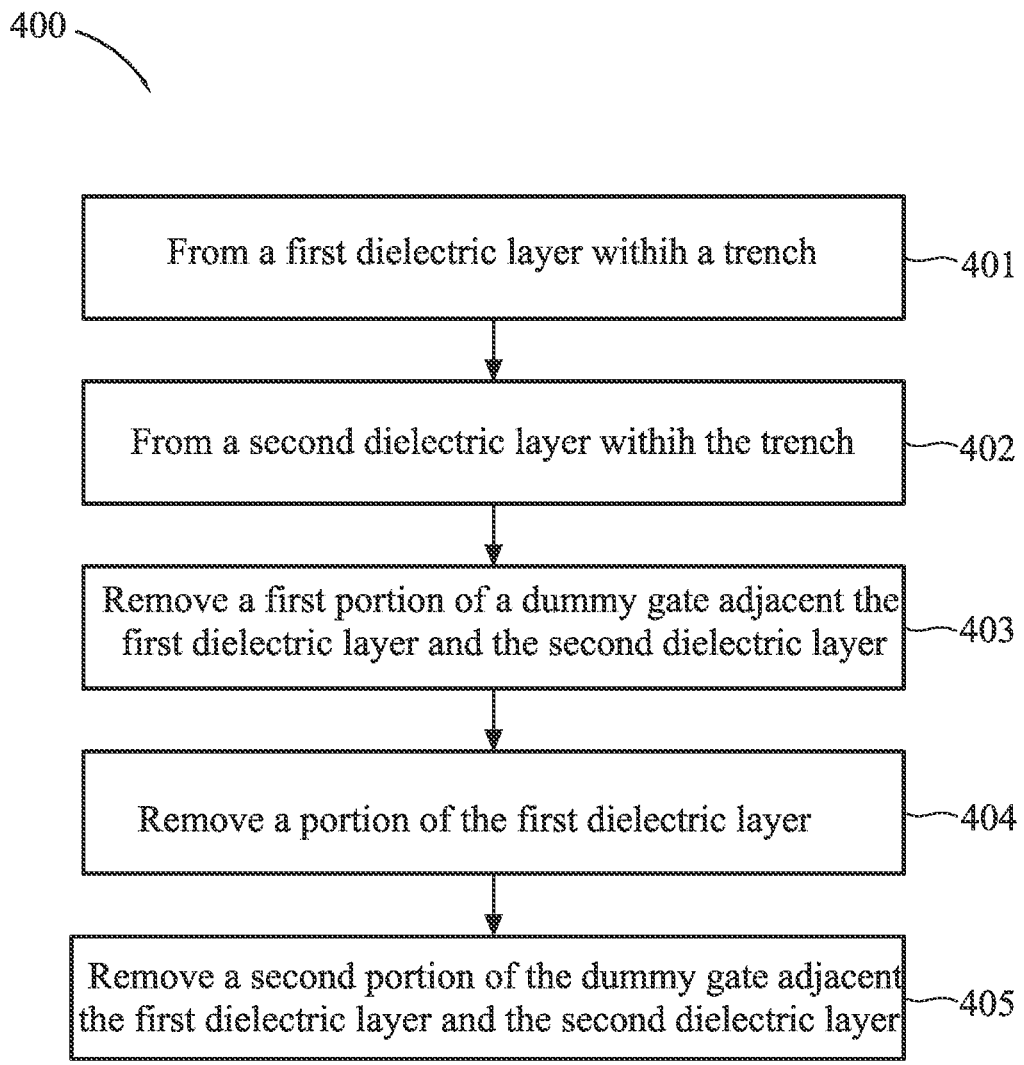
FIG. 4A is a flow diagram illustrating an example process for forming the multi-layer dielectric structure of FIG. 3A, in accordance with some embodiments.

FIG. 4A is a flow diagram illustrating an example process 400 for fabricating semiconductor device 100. FIGS. 4B-4F illustrate cross sections (cut from cross section 180 shown in FIG. 1) of semiconductor device 100 at various steps of process 400. Process 400 generally includes formation of the embodiment of dielectric structure 174 shown in FIG. 3A. This embodiment of dielectric structure 174 includes two layers and a stepped profile.

At a step 401, a first dielectric layer is formed within a trench (FIG. 4B). As shown in the cross section FIG. 4B, the first dielectric layer 311 is formed within trench 210 such that it does not fill the entirety of trench 210. In FIG. 4B, the variable $W_T$ denotes the width of trench 210 and the variable $H_1$ denotes the height of a portion of dummy gate 220 measured from a top surface of dummy gate dielectric 240 to a bottom surface of mask layer 230. As in FIG. 2, the variable $W_D$ denotes the width of dummy fin 142 in FIG. 4B. In some embodiments, the height $H_1$ is between 50 angstroms and 2000 angstroms, however heights outside of this range are also contemplated. In some embodiments, the width $W_T$ is between 1 angstrom and 800 angstroms, however widths outside of this range are also contemplated. The width $W_T$ can generally be larger than, equal to, or smaller than the width $W_D$ depending on the application.

At a step 402, a second dielectric layer is formed within the trench (FIG. 4C). As shown in the cross section FIG. 4C, the second dielectric layer 312 is formed within trench 210 such that it generally fills trench 210 along with the first dielectric layer 311. The first dielectric layer 311 and the second dielectric layer 312 can be formed within trench 210 using a variety of suitable approaches. For example, the first dielectric layer 311 and the second dielectric layer 312 can be formed within trench 210 using a re-fill process.

At a step 403, a first portion of a dummy gate adjacent the first dielectric layer and the second dielectric layer is removed (FIG. 4D). As shown in the cross section FIG. 4D, a portion of dummy gate 220 adjacent the first dielectric layer 311 and the second dielectric layer 312 is removed. In FIG. 4D, the height of this portion of dummy gate 220 that is removed is denoted by the variable $H_2$. In this example, the height $H_2$ is less than the height $H_1$ shown in FIG. 4B which thereby can result in a stepped profile for dielectric structure 174 as a whole. For example, the height $H_2$ in FIG. 4D can be about 60%-80% of the height $H_1$ in FIG. 4B, among other variations in height. The first portion of dummy gate 220 can be removed using various suitable processes, such as suitable etching processes for removing polysilicon material. The amount of material removed from dummy gate 220 can be controlled in this manner in order to ultimately control the profile of dielectric structure 174.

Figure 4F:
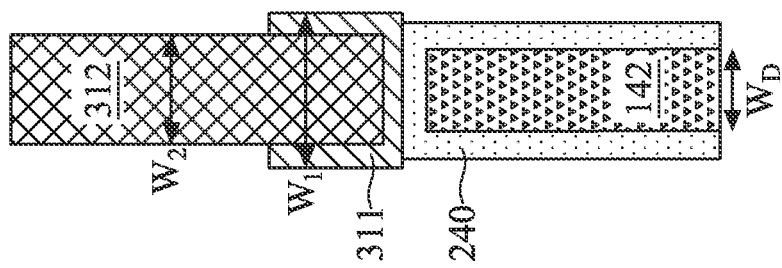
Figure 4E:
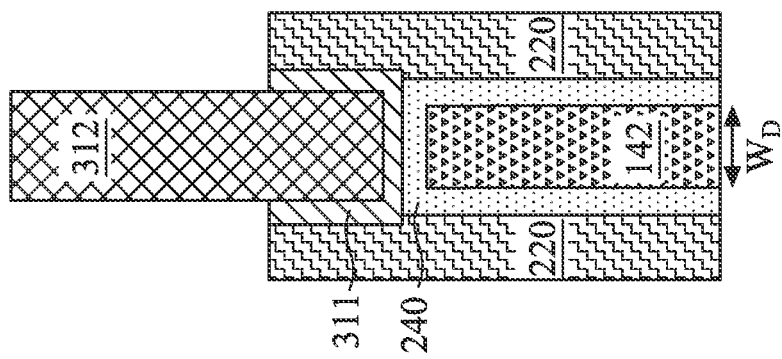

At a step 404, a portion of the first dielectric layer is removed (FIG. 4E). As shown in the cross section FIG. 4E, two vertical portions of the first dielectric layer 311 on opposing sides of the second dielectric layer 312 are removed down to the top surface of the remaining material from dummy gate 220. In step 404, the portion of the first dielectric layer 311 is removed such that a width of a bottom portion the overall dielectric structure 174 closest to dummy fin 142 is greater than a width of a top portion of the overall dielectric structure 174 opposite the bottom portion, as discussed in more detail below. As a result, dielectric structure 174 will generally have a stepped profile, and the stepped profile can be advantageous in certain applications.

At a step 405, a second portion of the dummy gate adjacent the first dielectric layer and the second dielectric layer is removed (FIG. 4F). As shown in the cross section FIG. 4F, the remaining material from dummy gate 220 adjacent the first dielectric layer 311, the second dielectric layer 312, dummy gate dielectric 240, and dummy fin 142 is removed. Similar to step 403, the second portion of dummy gate 220 can be removed using various suitable processes, such as suitable etching processes for removing polysilicon material. In FIG. 4F, the width of the bottom portion of dielectric structure 174 is denoted by the variable $W_1$ and the width of the top portion of dielectric structure 174 is denoted by the variable $W_2$. As illustrated, the width $W_1$ is greater than the width $W_2$. In this example, the width $W_1$ is between 3 angstroms and 400 angstroms, however widths outside of this range are also contemplated. Moreover, in this example, the width $W_2$ is between 5 angstroms and 500 angstroms, however widths outside of this range are also contemplated.

Figure 5A:
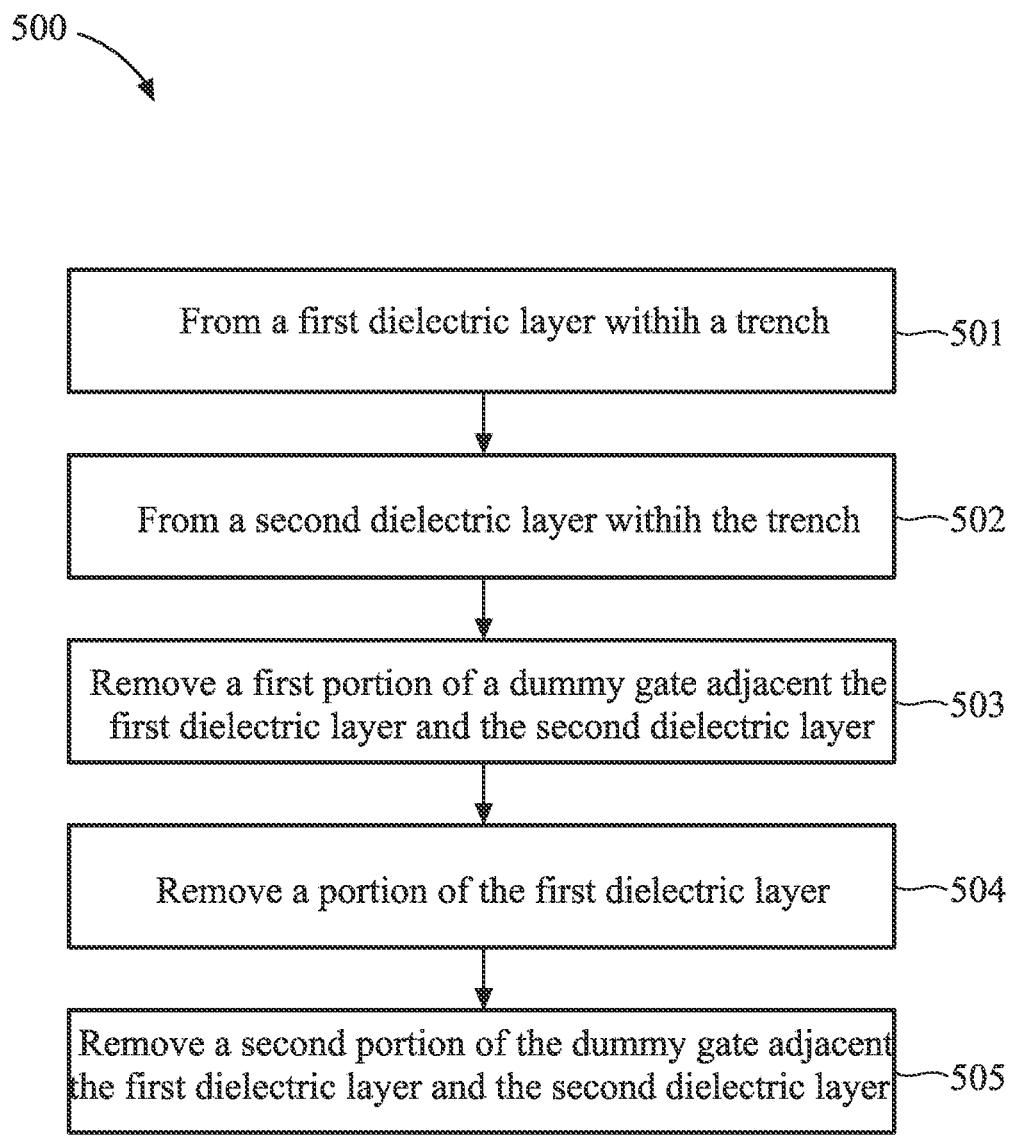
FIG. 5A is a flow diagram illustrating an example process for forming the multi-layer dielectric structure of FIG. 3B, in accordance with some embodiments.

FIG. 5A is a flow diagram illustrating another example process 500 for fabricating semiconductor device 100. FIGS. 5B-5F illustrate cross sections (cut from cross section 180 shown in FIG. 1) of semiconductor device 100 at various steps of process 500. Process 500 generally includes of the embodiment of dielectric structure 174 shown in FIG. 3B. This embodiment of dielectric structure 174 includes two layers and a linear profile.

Figure 5D:
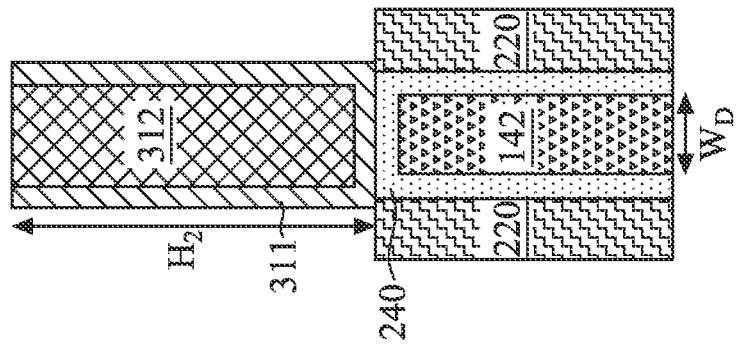
FIGS. 5B-5F illustrate cross sections of the semiconductor device of FIG. 1 at various steps of the process of FIG. 5A, in accordance with some embodiments.
Figure 5C:
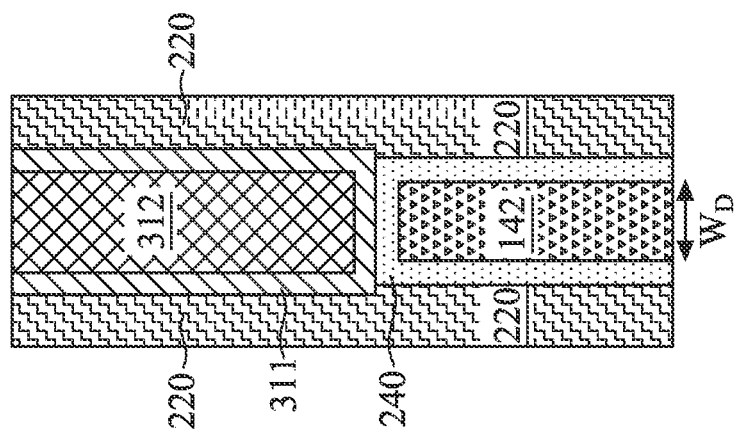
Figure 5B:
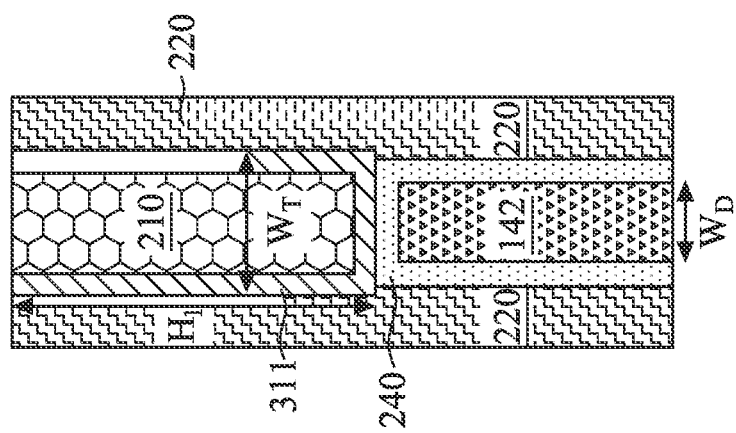

At a step 501, a first dielectric layer is formed within a trench (FIG. 5B). As shown in the cross section FIG. 5B, the first dielectric layer 311 is formed within trench 210 such that it does not fill the entirety of trench 210. In FIG. 5B, the variable $W_T$ denotes the width of trench 210 and the variable $H_1$ denotes the height of a portion of dummy gate 220 measured from a top surface of dummy gate dielectric 240 to a bottom surface of mask layer 230. As in FIG. 2, the variable $W_D$ denotes the width of dummy fin 142 in FIG. 5B. In some embodiments, the height $H_1$ is between 50 angstroms and 2000 angstroms, however heights outside of this range are also contemplated. In some embodiments, the width $W_T$ is between 1 angstrom and 800 angstroms, however widths outside of this range are also contemplated. The width $W_T$ can generally be larger than, equal to, or smaller than the width $W_D$ depending on the application.

At a step 502, a second dielectric layer is formed within the trench (FIG. 5C). As shown in the cross section FIG. 5C, the second dielectric layer 312 is formed within trench 210 such that it generally fills trench 210 along with the first dielectric layer 311. The first dielectric layer 311 and the second dielectric layer 312 can be formed within trench 210 using a variety of suitable approaches. For example, the first dielectric layer 311 and the second dielectric layer 312 can be formed within trench 210 using a re-fill process.

At a step 503, a first portion of a dummy gate adjacent the first dielectric layer and the second dielectric layer is removed (FIG. 5D). As shown in the cross section of FIG. 5D, a portion of dummy gate 220 adjacent the first dielectric layer 311 and the second dielectric layer 312 is removed. In FIG. 5D, the height of this portion of dummy gate 220 that is removed is denoted by the variable $H_2$. Unlike step 403 of process 400 illustrated in FIG. 4D, in this example, the height $H_2$ is equal to or about equal to (e.g. within 10%) the height $H_1$ shown in FIG. 5B. As a result, dielectric structure 174 will not have a stepped profile and will instead have a generally linear profile. The first portion of dummy gate 220 can be removed using various suitable processes, such as suitable etching processes for removing polysilicon material.

Figure 5F:
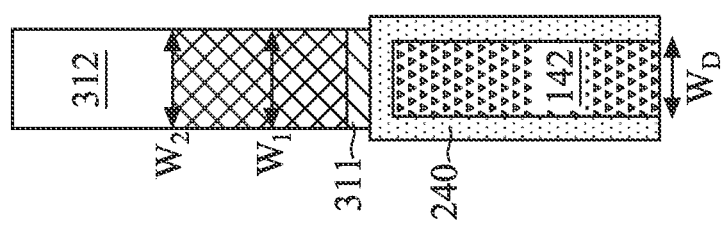
Figure 5E:
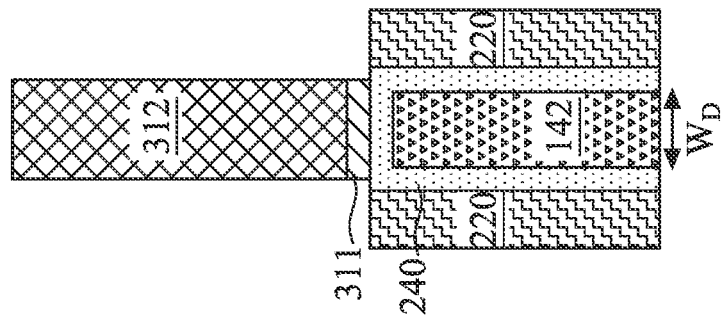

At a step 504, a portion of the first dielectric layer is removed (FIG. 5E). As shown in the cross section FIG. 5E, two vertical portions of the first dielectric layer 311 on opposing sides of the second dielectric layer 312 are removed, thereby leaving only a horizontal portion of the first dielectric that is disposed underneath the second dielectric layer 312. In step 504, the portion of the first dielectric layer 311 is removed such that a width of a bottom portion the overall dielectric structure 174 closest to dummy fin 142 is equal to or about equal to (e.g. within 10%) a width of a top portion of the overall dielectric structure 174 opposite the bottom portion, as discussed in more detail below. As a result, dielectric structure 174 will generally have a linear profile, and this linear profile can be advantageous in certain applications.

At a step 505, a second portion of the dummy gate adjacent the first dielectric layer and the second dielectric layer is removed (FIG. 5F). As shown in the cross section of FIG. 5F, the remaining material from dummy gate 220 adjacent the first dielectric layer 311, the second dielectric layer 312, dummy gate dielectric 240, and dummy fin 142 is removed. Similar to step 503, the second portion of dummy gate 220 can be removed using various suitable processes, such as suitable etching processes for removing polysilicon material. In FIG. 5F, the width of the bottom portion of dielectric structure 174 is denoted by the variable $W_1$ and the width of the top portion of dielectric structure 174 is denoted by the variable $W_2$. As illustrated, the width $W_1$ is equal to or about equal to (e.g. within 10%) the width $W_2$. In this example, the width $W_1$ is between 3 angstroms and 400 angstroms, however widths outside of this range are also contemplated. In this example, the width $W_2$ is also between 3 angstroms and 400 angstroms, however widths outside of this range are also contemplated.

Figure 6A:
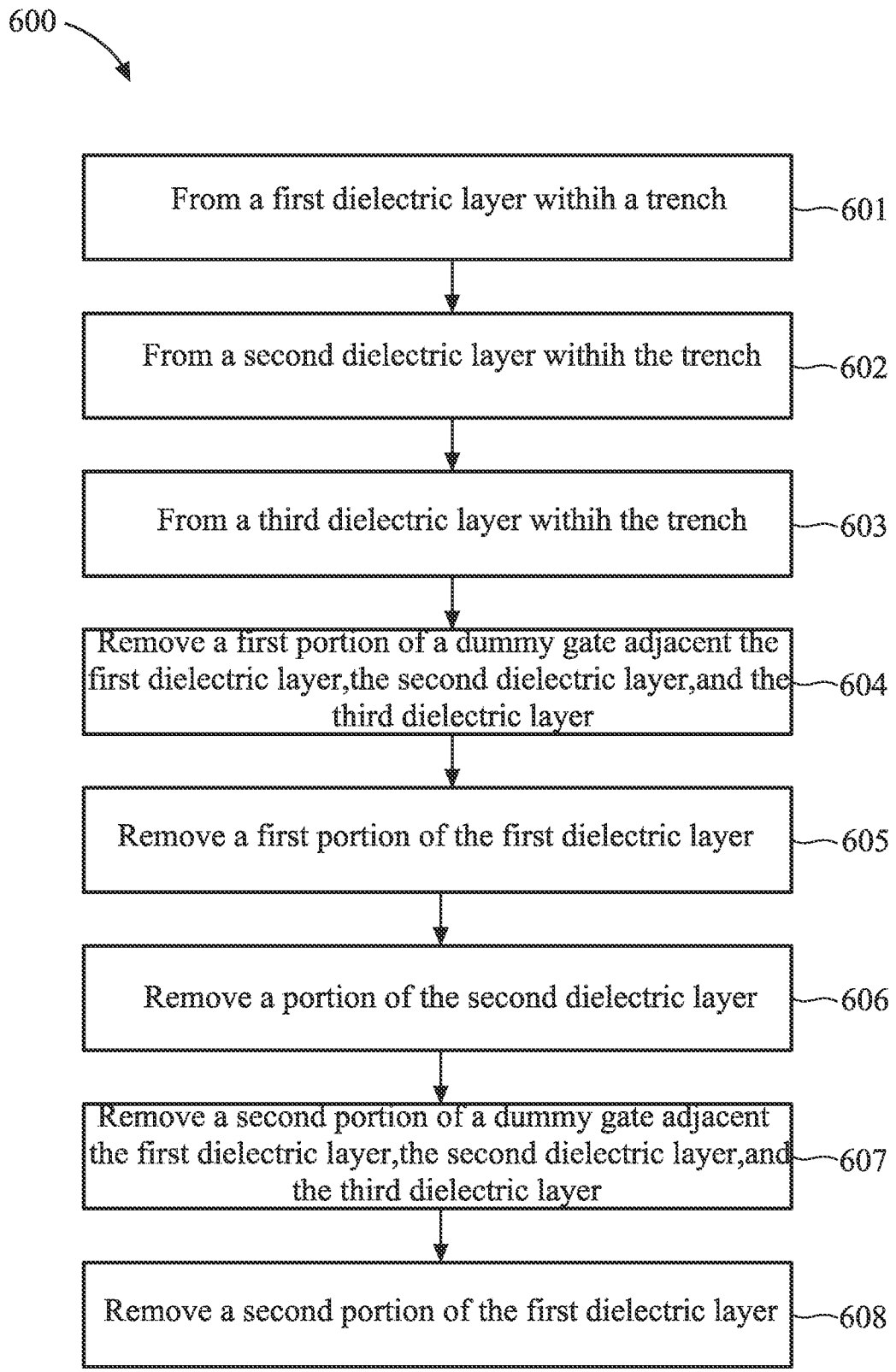
FIG. 6A is a flow diagram illustrating an example process for forming the multi-layer dielectric structure of FIG. 3C, in accordance with some embodiments.

FIG. 6A is a flow diagram illustrating yet another example process 600 for fabricating semiconductor device 100. FIGS. 6B-6I illustrate cross sections (cut from cross section 180 shown in FIG. 1) of semiconductor device 100 at various steps of process 600. Process 600 generally includes formation of the embodiment of dielectric structure 174 shown in FIG. 3C. This embodiment of dielectric structure 174 includes three layers and a stepped profile.

At a step 601, a first dielectric layer is formed within a trench (FIG. 6B). As shown in the cross section FIG. 6B, the first dielectric layer 311 is formed within trench 210 such that it does not fill the entirety of trench 210. In FIG. 6B, the variable $W_T$ denotes the width of trench 210 and the variable $H_1$ denotes the height of a portion of dummy gate 220 measured from a top surface of dummy gate dielectric 240 to a bottom surface of mask layer 230. As in FIG. 2, the variable $W_D$ denotes the width of dummy fin 142 in FIG. 6B. In some embodiments, the height $H_1$ is between 50 angstroms and 2000 angstroms, however heights outside of this range are also contemplated. In some embodiments, the width $W_T$ is between 1 angstrom and 800 angstroms, however widths outside of this range are also contemplated. The width $W_T$ can generally be larger than, equal to, or smaller than the width $W_D$ depending on the application.

At a step 602, a second dielectric layer is formed within the trench (FIG. 6C). As shown in the cross section FIG. 6C, the second dielectric layer 312 is formed within trench 210, however the combination of the first dielectric layer 311 and the second dielectric layer 312 does not entirely fill trench 210. The first dielectric layer 311 and the second dielectric layer 312 can be formed within trench 210 using a variety of suitable approaches. For example, the first dielectric layer 311 and the second dielectric layer 312 can be formed within trench 210 using a re-fill process.

At a step 603, a third dielectric layer is formed within the trench (FIG. 6D). As shown in the cross section FIG. 6D, the third dielectric layer 313 is formed within trench 210 such that it generally fills trench 210 along with the first dielectric layer 311 and the second dielectric layer 312. The third dielectric layer 313 can also be formed within trench 210 using a variety of suitable approaches. For example, the third dielectric layer 313 be formed within trench 210 using a re-fill process.

At a step 604, a first portion of a dummy gate adjacent the first dielectric layer, the second dielectric layer, and the third dielectric layer is removed (FIG. 6E). As shown in the cross section FIG. 6E, a portion of dummy gate 220 adjacent the first dielectric layer 311, the second dielectric layer 312, and the third dielectric layer 313 is removed. In FIG. 6E, the height of this portion of dummy gate 220 that is removed is denoted by the variable $H_2$. In this example, the height $H_2$ is less than the height $H_1$ shown in FIG. 6B which thereby can result in a stepped profile for dielectric structure 174 as a whole. For example, the height $H_2$ in FIG. 4D can be about 60%-80% of the height $H_1$ in FIG. 4B, among other variations in height. The first portion of dummy gate 220 can be removed using various suitable processes, such as suitable etching processes for removing polysilicon material.

Figure 6I:
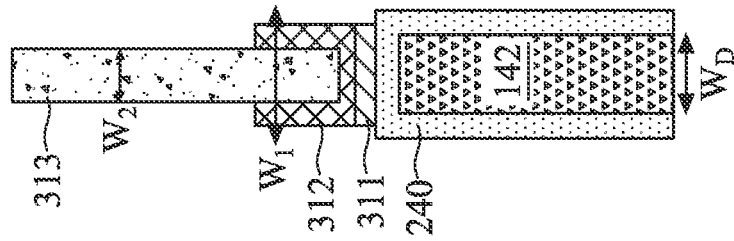
Figure 6H:
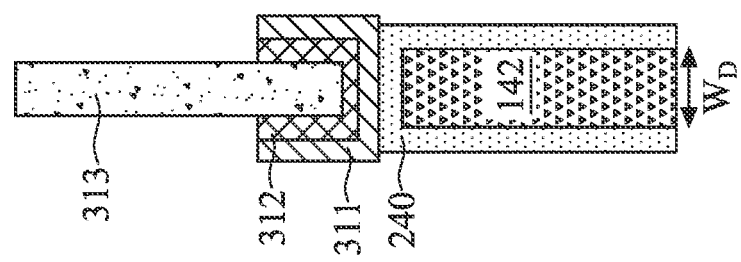
Figure 6G:
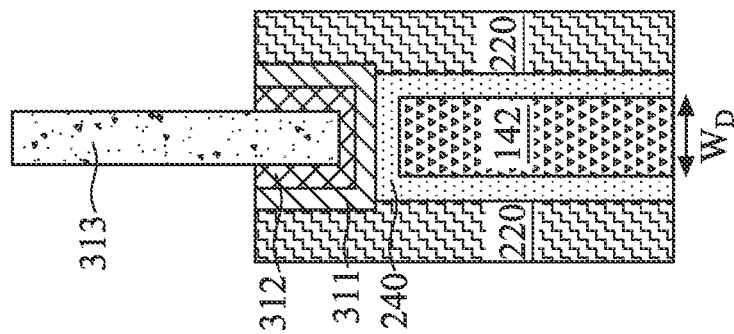
Figure 6F:
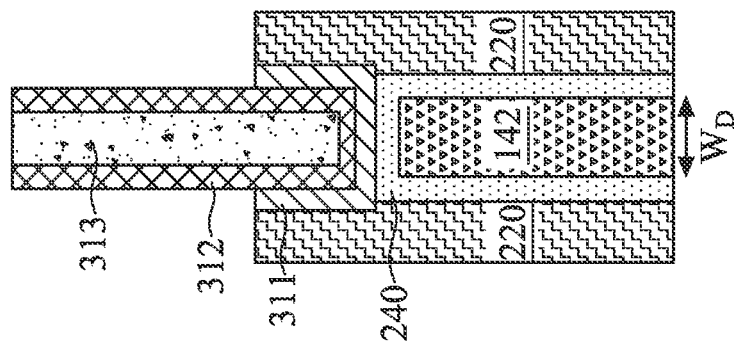

At a step 605, a first portion of the first dielectric layer is removed (FIG. 6F). As shown in the cross section of FIG. 6F, two vertical portions of the first dielectric layer 311 on opposing sides of the second dielectric layer 312 and the third dielectric layer 313 are removed down to the top surface of the remaining material from dummy gate 220. The removal of the first portion of the first dielectric layer 311 in this manner ultimately helps create a multi-layered dielectric structure with a stepped profile.

At a step 606, a portion of the second dielectric layer is removed (FIG. 6G). As shown in the cross section of FIG. 6G, two vertical portions of the second dielectric layer 312 on opposing sides of the third dielectric layer 313 are removed down to the top surface of the remaining material from dummy gate 220. The removal of the portion of the second dielectric layer 312 in this manner ultimately helps create a multi-layered dielectric structure with a stepped profile.

At a step 607, a second portion of a dummy gate adjacent the first dielectric layer, the second dielectric layer, and the third dielectric layer is removed (FIG. 6H). As shown in the cross section of FIG. 6H, the remaining material from dummy gate 220 adjacent the first dielectric layer 311, the second dielectric layer 312, the third dielectric layer 313, dummy gate dielectric 240, and dummy fin 142 is removed. Similar to step 604, the second portion of dummy gate 220 can be removed using various suitable processes, such as suitable etching processes for removing polysilicon material.

At a step 608, a second portion of the first dielectric layer is removed (FIG. 6I). As shown in the cross section of FIG. 6I, the remaining two vertical portions of the first dielectric layer 311 are removed, thereby creating a thinner profile for the overall dielectric structure 174. In FIG. 6I, the width of the bottom portion of dielectric structure 174 is denoted by the variable $W_1$ and the width of the top portion of dielectric structure 174 is denoted by the variable $W_2$. As illustrated, the width $W_1$ is greater than the width $W_2$. In this example, the width $W_1$ is between 2 angstroms and 300 angstroms, however widths outside of this range are also contemplated. Moreover, in this example, the width $W_2$ is between 3 angstroms and 400 angstroms, however widths outside of this range are also contemplated. By using three dielectric layers, the width $W_2$ can be made smaller than or equal to the width $W_D$ depending on the intended application. By making dielectric structure 174 thinner, the process window for forming gate 114 can be enlarged, thereby leading to improvements in the formation of gate 114.

After step 405 is completed in process 400, step 505 is completed in process 500, and after step 608 is completed in process 600, respectively, the fabrication process for semiconductor device 100 generally continues with removal of dummy gate 220 and formation of gate 114, as discussed above. It will be appreciated that the removal steps described with respect to processes 400, 500, and 600 can be performed using a variety of suitable etching processes, including both wet etching and dry etching processes. Moreover, a variety of different etchant materials can be used in these steps depending on the intended application.

Those skilled in the art will appreciate that processes 400, 500, and 600 can be adapted in various ways to form different embodiments of a multi-layer dielectric structure for use in semiconductor devices. For example, step 607 can be modified in process 600 in order to create a multi-layer dielectric structure with a dual-stepped profile, such as the embodiment shown in FIG. 3D. Moreover, various methods for forming and removing the various materials discussed with respect to these processes can be adapted depending on the intended application. These adaptations are contemplated within the scope of the present disclosure.

As described in detail above, the present disclosure provides various embodiments of a semiconductor device and a method of forming a semiconductor device including a multi-layer dielectric structure disposed above a fin of the semiconductor device (e.g. a fin of a FinFET device). The multi-layered approach to forming the dielectric structure can provide profile control for the dielectric structure such that shadowing effects and other undesirable effects can be avoided in many applications. The ability to control the profile of the dielectric structure can facilitate advantages in terms of reducing the impact of variations in the removal of material from semiconductor device (e.g. removal of a dummy gate structure) and enlarging the process window for forming various structures in the semiconductor device (e.g. formation of metal gate structures). As a result, improvements in both semiconductor device yield and semiconductor device performance can be achieved using the approaches provided herein.

An implementation of the present disclosure is a semiconductor device. The semiconductor device includes an isolation structure, a fin extending above the isolation structure, dielectric material formed above the fin, and a gate formed over the isolation structure, over the fin, and adjacent the dielectric material. The dielectric material includes both a first dielectric layer and a second dielectric layer.

Another implementation of the present disclosure is a method of fabricating a semiconductor device. The method includes forming a trench above a fin of the semiconductor device, forming dielectric material within the trench by forming both a first dielectric layer within the trench and a second dielectric layer within the trench, and removing a portion of the first dielectric layer to control a profile of the dielectric material.

Yet another implementation of the present disclosure is another method for fabricating a semiconductor device. The method includes forming a trench above a fin of the semiconductor device, forming dielectric material within the trench by forming a first dielectric layer within the trench, forming a second dielectric layer within the trench, and forming a third dielectric layer within the trench, and removing a portion of the first dielectric layer to control a profile of the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   an isolation structure;
   a fin extending above the isolation structure; and
   a dielectric structure formed above the fin, the dielectric structure comprising both a first dielectric layer and a second dielectric layer;
   wherein the dielectric structure further comprises a third dielectric layer formed adjacent the second dielectric layer; and
   wherein a width of a bottom region of the dielectric structure closest to the fin is greater than a width of a top region of the dielectric structure disposed above the bottom region, and wherein a width of the dielectric structure is less than a width of the fin.

2. The device of claim 1, wherein the dielectric structure formed above the fin has a stepped profile as a result of a portion of the first dielectric layer having been removed.

3. A semiconductor device comprising:
   an isolation structure;
   a fin extending above the isolation structure; and
   a dielectric structure formed above the fin, the dielectric structure comprising both a first dielectric layer and a second dielectric layer;
   wherein the dielectric structure further comprises a third dielectric layer formed adjacent the second dielectric layer; and
   wherein a width of a bottom region of the dielectric structure closest to the fin is greater than a width of a middle region of the dielectric structure disposed above the bottom region, and wherein the width of the middle region of the dielectric structure disposed above the bottom region is greater than a width of a top region of the dielectric structure disposed above the middle region.

4. A method of fabricating a semiconductor device, the method comprising:
   forming a dummy gate structure;
   forming a trench adjacent a fin of the semiconductor device;
   forming a dielectric structure within the trench by forming both a first dielectric layer within the trench and a second dielectric layer within the trench; and
   removing a portion of the first dielectric layer to control a profile of the dielectric structure.

5. The method of claim 4, wherein forming the trench adjacent the fin comprises removing a portion of the dummy gate structure.

6. The method of claim 4, further comprising:
   removing the dummy gate structure adjacent the dielectric structure; and
   forming a metal gate structure adjacent the dielectric structure.

7. The method of claim 4, wherein forming the dielectric structure within the trench further comprises forming a third dielectric layer within the trench.

8. The method of claim 7, further comprising removing a portion of the second dielectric layer to control the profile of the dielectric structure, wherein:
   removing the portion of the first dielectric layer to control the profile of the dielectric structure comprises removing the portion of the first dielectric layer such that a width of a bottom region of the dielectric structure closest to the fin is greater than a width of a middle region of the dielectric structure disposed above the bottom region; and
   removing the portion of the second dielectric layer to control the profile of the dielectric structure comprises removing the portion of the second dielectric layer such that that the width of the middle region is greater than a width of a top region of the dielectric structure disposed above the middle region.

9. The method of claim 4, wherein removing the portion of the first dielectric layer to control the profile of the dielectric structure comprises removing the portion of the first dielectric layer such that a width of a bottom region of the dielectric structure closest to the fin is greater than a width of a top region of the dielectric structure disposed above the bottom region.

10. The method of claim 4, wherein removing the portion of the first dielectric layer to control the profile of the dielectric structure comprises removing the portion of the first dielectric layer such that the profile of the dielectric structure is a stepped profile.

11. The method of claim 4, wherein the fin includes a semiconductor material.

12. The method of claim 4, wherein the first dielectric layer and the second dielectric layer are formed by a re-fill process.

13. A method of fabricating a semiconductor device, the method comprising:
    forming a trench adjacent a fin of the semiconductor device;
    forming a dielectric structure within the trench by forming a first dielectric layer within the trench, forming a second dielectric layer within the trench, and forming a third dielectric layer within the trench; and
    removing a portion of the first dielectric layer to control a profile of the dielectric structure.

14. The method of claim 13, further comprising removing a portion of the second dielectric layer to control the profile of the dielectric structure.

15. The method of claim 14, wherein:
    removing the portion of the first dielectric layer to control the profile of the dielectric structure comprises removing the portion of the first dielectric layer such that a width of a bottom region of the dielectric structure closest to the fin is greater than a width of a middle region of the dielectric structure disposed above the bottom region; and
    removing the portion of the second dielectric layer to control the profile of the dielectric structure comprises removing the portion of the second dielectric layer such that that the width of the middle region is greater than a width of a top region of the dielectric structure disposed above the middle region.

16. The method of claim 14, wherein removing the portion of the first dielectric layer to control the profile of the dielectric structure and removing the portion of the second dielectric layer to control the profile of the dielectric structure comprises removing the portion of the first dielectric and removing the portion of the second dielectric layer such that a width of a bottom region of the dielectric structure closest to the fin is greater than a width of a top region of the dielectric structure disposed above the bottom region.

17. The method of claim 13, wherein forming the trench adjacent the fin comprises removing a portion of a dummy gate structure and a portion of a mask layer.

18. The method of claim 13, wherein removing the portion of the first dielectric layer to control the profile of the dielectric structure comprises removing the portion of the first dielectric layer such that the profile of the dielectric structure is a stepped profile or a linear profile.

19. The method of claim 13, wherein the fin includes a semiconductor material.

20. The method of claim 13, wherein the first dielectric layer and the second dielectric layer are formed by a re-fill process.

* * * * *